(12) United States Patent
Nad et al.

(10) Patent No.: US 11,177,232 B2
(45) Date of Patent: Nov. 16, 2021

(54) CIRCUIT DEVICE WITH MONOLAYER BONDING BETWEEN SURFACE STRUCTURES

(71) Applicant: Intel Corporation, Santa Clara, CA (US)

(72) Inventors: Suddhasattwa Nad, Chandler, AZ (US); Rahul N. Manepalli, Chandler, AZ (US); Marcel A. Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 664 days.

(21) Appl. No.: 15/943,289

(22) Filed: Apr. 2, 2018

(65) Prior Publication Data

US 2019/0229082 A1    Jul. 25, 2019

Related U.S. Application Data

(60) Provisional application No. 62/620,962, filed on Jan. 23, 2018.

(51) Int. Cl.
*H01L 23/532* (2006.01)
*H01L 23/00* (2006.01)
(Continued)

(52) U.S. Cl.
CPC .......... *H01L 24/27* (2013.01); *H01L 23/5329* (2013.01); *H01L 23/53238* (2013.01);
(Continued)

(58) Field of Classification Search
CPC ............... H01L 24/27; H01L 23/53238; H01L 23/5329; H01L 24/30; H01L 24/33;
(Continued)

(56) References Cited

U.S. PATENT DOCUMENTS 5,639,555 A     6/1997   Bishop
2005/0017759 A1  1/2005  Weber et al.
(Continued)

FOREIGN PATENT DOCUMENTS

WO      2010095046      8/2010

OTHER PUBLICATIONS

International Patent Application No. PCT/US2017/053787, filed on Sep. 27, 2017.
(Continued)

*Primary Examiner* — Fernando L Toledo
*Assistant Examiner* — Neil R Prasad
(74) *Attorney, Agent, or Firm* — Essential Patents Group LLP.

(57) ABSTRACT

Techniques and mechanisms for bonding structures of a circuit device with a monolayer. In an embodiment, a patterned metallization layer or a first dielectric layer includes a first surface portion. The first surface portion is exposed to first molecules which each include a first head group and a first end group which is substantially non-reactive with the first head group. The first head groups attach to the first portion to form a first self-assembled monolayer, which is subsequently reacted with second molecules to form a second monolayer comprising moieties of the first molecules. In another embodiment, the first head group comprises a first moiety comprising a sulfur atom or a nitrogen atom, where the first end group comprises one of an acid moiety, an acid anhydride moiety, an aliphatic alcohol moiety, an aromatic alcohol moiety, or an unsaturated hydrocarbon moiety.

19 Claims, 8 Drawing Sheets

(51) Int. Cl.
  *H05K 1/02* (2006.01)
  *C08L 101/02* (2006.01)
(52) U.S. Cl.
  CPC .............. *H01L 24/30* (2013.01); *H01L 24/33* (2013.01); *H05K 1/0231* (2013.01); *C08L 101/02* (2013.01); *C08L 2203/20* (2013.01); *H01L 2224/16225* (2013.01)
(58) Field of Classification Search
  CPC ........ H01L 2224/16225; H05K 1/0231; C08L 101/02; C08L 2203/20
  See application file for complete search history.

(56) References Cited

U.S. PATENT DOCUMENTS

| | | |
|---|---|---|
| 2006/0289115 A1 | 12/2006 | Zhao et al. |
| 2013/0319610 A1 | 12/2013 | Wiessler et al. |
| 2014/0183737 A1* | 7/2014 | Zhang ............... H01L 21/76841 |
| | | 257/751 |
| 2016/0027373 A1 | 1/2016 | Han |
| 2017/0294395 A1* | 10/2017 | Happoya ................. H01L 24/05 |

OTHER PUBLICATIONS

International Search Report and Written Opinion for International Patent Application No. PCT/US17/53787, dated Jun. 14, 2018.
International Preliminary Report on Patentability for PCT Application No. PCT/US2017/053787, dated Apr. 9, 2020.
Kloxin, C. et al., "Covalent Adaptable Networks (CANs): A Unique Paradigm in Crosslink Polymers", Macromolecules; Mar. 23, 2010; vol. 43, No. 6, pp. 2643-2653.
Tasdelen, Mehmet Atilla, "Diels-Alder "click" reactions: recent applications in polymer and material science", Polymer Chemistry; 2011, 2, pp. 2133-2145.

* cited by examiner

CIRCUIT DEVICE WITH MONOLAYER BONDING BETWEEN SURFACE STRUCTURES

This non-provisional patent application is related to, and claims priority to, the provisional application entitled "CIRCUIT DEVICE WITH SURFACES BONDED TOGETHER BY A MONOLAYER," filed Jan. 23, 2018, having an application Ser. No. 62/620,962, the entire contents of which are incorporated herein by reference.

BACKGROUND

1. Technical Field

Embodiments of the invention generally relate to integrated circuit (IC) package and printed circuit board (PCB) technologies and, more particularly but not exclusively, to techniques for bonding layers of a substrate.

2. Background Art

High density substrates are moving toward feature sizes which test the capabilities of traditional manufacturing technologies. Such technologies often use low numerical aperture (NA) lithography—e.g., NA<0.1—laser via drilling, and surface roughening of dielectric or metal layers. Roughening is a mechanically driven process used in both PCB and package substrate technology to promote adhesion between one dielectric layer and another, or between one dielectric layer and a metal layer. The effectiveness of roughening tends to be compromised as substrate feature sizes approach a few microns.

At such small dimensions, the amount of roughening needed to adequately adhere layers puts at risk the integrity of signals and/or power to be provided by metallization structures. Roughening of metal traces results in material loss, which is a relatively minor issue for large traces, but which becomes appreciable with trace dimensions approaching the single micron scale. Such loss of material tends to increase minimum resolution requirements in order to account for the added risk to metal trace fidelity.

Chip-to-chip interconnection is an important function of an IC substrate package. Emerging high speed IO data transfer interfaces like PCI gen4, PAM4, 56G, are driving the need for improved signal integrity, minimal insertion loss at very high frequencies (28 GHz+) in a IC substrate. At high frequencies, a larger portion of a signal is conducted very close to the surface of a conducting material, a phenomenon known as the "skin effect." At 1 MHz signal transfer this skin depth is typically about 66 μm, while at 28 GHz it reduces to about 400 nm and to about 200 nm at 100 GHz. Hence, trace roughness starts playing a significant role in reducing signal losses at high frequencies.

Substrates for next generation chip-to-chip interconnect technologies depend significantly on routing which enables higher speed and higher density input/output (IO). Higher speed I/O data transfer is expected to be needed to support next-generation interconnects. Such interconnects need to operate with high frequencies while having low signal losses. One technical roadblock in these next generation packages is inadequate adhesion of a dielectric material to a smooth conductive (e.g., copper) surface. For a signal routed thru a package trace, factors that play an important role in determining insertion loss per unit length of the package trace include roughness of the trace conductor carrying the signal and dielectric loss of the build-up material surrounding the trace. In some high frequency applications, it may be necessary to provide an interface with a surface roughness of less than 100 nm and/or to provide a dielectric material with a loss tangent which is less than 0.005.

The current state of the art of trace formation in IC substrates includes use of a semi-additive process (SAP), wherein a dielectric material is first roughened on the surface using a process called desmear. Electroless copper seed is deposited onto this roughened surface followed by electroplating of patterns (traces, planes, pads etc.) using a lithographically defined resist pattern. The resist pattern is then removed and the underlying seed layer is etched away to create the required interconnects. The plated copper layers (traces, planes, pads etc.) are then micro-roughened using a process known as CZ. The primary purpose of this process is to micro roughen the copper, increase the surface area significantly in preparation of the build-up material lamination. During lamination, the buildup material flows into the crevices of copper and interlocks with copper, forming a strongly bonded network—increasing the fracture strength of the interface significantly. Roughness of the copper is a metric that is controlled to ensure interface reliability between dielectric and metal in IC substrate packages.

With the emerging need for reduced roughness to enable high speed IO signaling, package reliability becomes a significant concern. As successive generations of fabrication techniques continue to scale down in size, there is expected to be an increased premium placed on incremental improvements to processes for bonding layers of a substrate.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
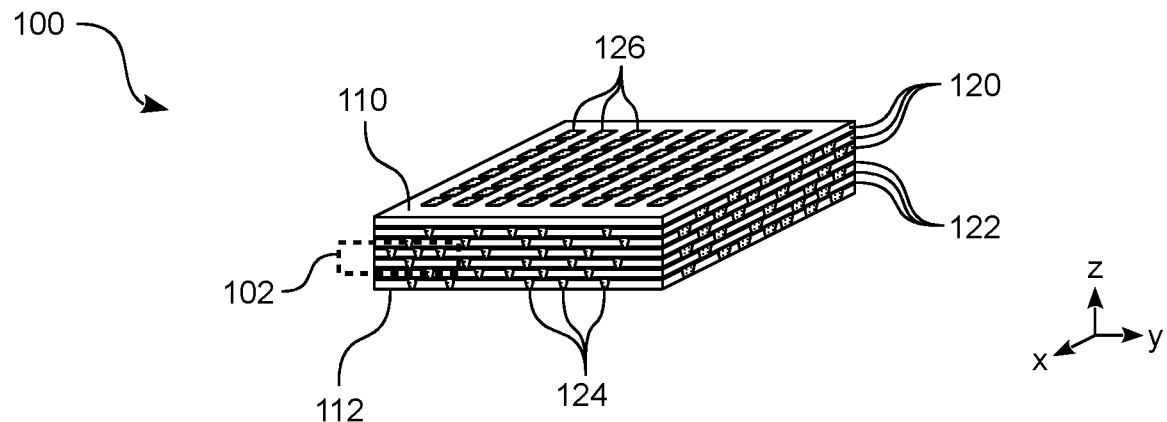
FIG. 1 shows various views illustrating elements of a substrate including layers which are bonded to one another according to an embodiment.
Figure 1:
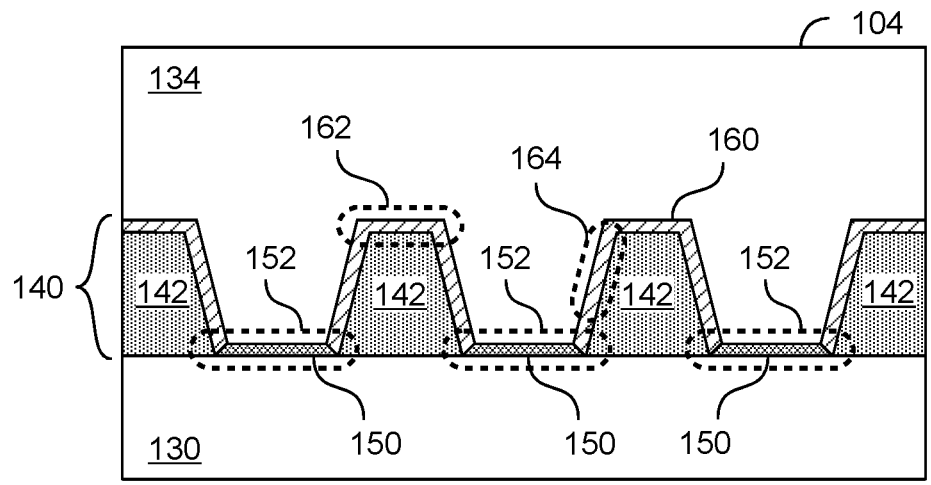
Figure 1:
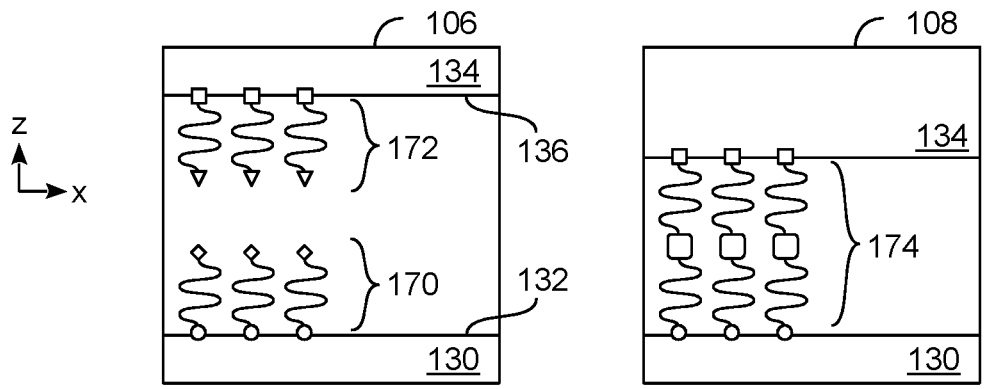

Embodiments discussed herein variously provide techniques and mechanisms for improved bonding of layers of a substrate using a reaction by one monolayer to form another monolayer. The term "monolayer" refers herein to a film of a given molecule, wherein the film is only one molecule thick on a surface structure. "Self-assembled monolayer" (or "SAM") refers herein to a monolayer formed by a reaction at a surface, wherein such reaction results in monolayer molecules lining up in a uniform manner. More particularly, molecules may "self assemble" by each forming a respective highly selective bond at the surface and orientate itself perpendicular to the face of the surface. Through such a reaction, a uniform monolayer film may be formed. In the context of any given monolayer, a molecule (or molecules) of the monolayer refers herein to those molecules which are each of the majority molecule type in the monolayer.

In various embodiments, at least some portion of a surface ("surface portion") is bonded to at least some portion of another surface via a monolayer, molecules of which may be a product of a chemical reaction by molecules of an earlier-formed monolayer. Such a reaction may extend molecules of the earlier-formed monolayer—e.g., by joining respective molecules of two earlier-formed monolayers which were bonded each to a different respective surface portion.

Bonding of surface portions according to one embodiment may include forming a first monolayer of a molecule M1 on a first surface portion. The M1 molecule may have a structure R1-X1-R2, wherein functional groups R1, R2 are at opposite ends of an organic moiety X1 that, for example, includes a chain of carbon atoms. Functional group R2 (for brevity, also referred to herein simply as "R2") may be substantially non-reactive with functional group R1 (or simply "R1"). Such non-reactivity between R1 and R2 may mitigate self-polymerization of a M1 molecule, thus facilitating formation of a monolayer of M1 molecules. As used herein in the context of two given functional groups, "substantially non-reactive" means that, at least at standard temperature and pressure, one functional group will not bond with or otherwise chemically react with the other functional group. In some embodiments, R2 is also substantially non-reactive with a conductor (or non-reactive with a dielectric) of the surface portion to which R1 bonds. In one example embodiment, R2 includes any of a variety of acids, acid anhydrides, aliphatic alcohols, aromatic alcohols, or unsaturated hydrocarbons.

Although some embodiments are not limited in this regard, M1 molecules of the first monolayer may then be modified into M1' molecules—e.g., prior to bonding of the first surface portion with a second surface portion. For example, M1 molecules may be modified by a chemical process (e.g., including acylation and/or esterification) which results in another functional group R3 in place of the previous R2 functional group.

Another molecule M2 may subsequently be reacted with M1 molecules of the first monolayer (or in some embodiments, with M1' molecules of a modified first monolayer) to form a second monolayer. The M2 molecules may each have a structure R4-X2-R5, wherein functional groups R4, R5 are at opposite ends of an organic moiety X2. In such an embodiment, R4 functional groups of the M2 molecules may react with R2 functional groups of the first monolayer (or in some embodiments, with M1' molecules of a modified first monolayer) to variously bond moieties X1, X2 together and to form a monolayer of M3 molecules. The M3 molecules may each have a structure R1-X1-R6-X2-R5, wherein the moiety R6—referred to herein as an "intermediate moiety"—is formed by reaction of R2 with R4 (or in some embodiments, by reaction of R3 with R4).

The M3 molecules may be subsequently bonded, via the R5 functional groups thereof, to a second surface portion, wherein the first surface and the second surface portion are bonded to each other by the second monolayer. In other embodiments, the M2 molecules are bonded to the second surface portion prior to being reacted with M1 molecules of the first monolayer (or in some embodiments, with M1' molecules of a modified first monolayer).

In such an embodiment, one of R1 or R5 may be suitable to adhere to (e.g., bond with) a conductive surface—e.g., wherein the other of R1 or R5 is suitable to adhere to a dielectric surface. Both R1 and R5 may be suitable each to adhere to a respective dielectric surface (e.g., wherein one of R1 or R5 is further suitable to adhere to a conductor). For example, R1 may include, or be a derivative of, any of a variety of thiols, disulfides, amines, azoles, amides, imides, pyridine derivatives, cyanoacrylate derivatives or other moieties which include a sulfur atom or a nitrogen atom. Alternatively or in addition, R5 may include, or be a derivative of, any of a variety of amines, azoles, imides, or cyanoacrylate derivatives—e.g., wherein R5 enables a strong covalent bond with a dielectric polymer. Bonding or other adhering of a functional group with a surface portion may be via chemisorption or physisorption, in some embodiments.

The functional group R3—that, in some embodiments, is produced from a reaction by R2—may include a group resulting from acylation or esterification of an acid anhydride, a thioanhydride, or an amide. Functional group R4 may be reactive with R2 and/or with any functional group R3 that might be produced from R2 prior to reaction with a M2 molecule. For example, R4 may include, or be a derivative of, any of a variety of amines, thiols, disulfides, acid anhydrides, or alcohols. In some embodiments, R4 is substantially non-reactive with R5.

The organic moiety X1 of molecule M1 (and/or the organic moiety X2 of molecule M2) may comprise an aliphatic chain of carbon atoms—e.g., wherein the chain is saturated. In some embodiments, X1 (or X2) includes a derivative of an ethyl group, a propyl group, a butyl group or the like. Alternatively, organic moiety X1 or organic moiety X2 may include a long chain of aliphatic chain of carbon atoms, the structure of which is resistive of chain folding.

Although some embodiments are not limited in this regard, a reaction to form the second monolayer from the first monolayer may include an addition reaction between the M1 and M2. The term "addition reaction" refers herein to a reaction between two molecules which combine to form, as a single reaction product (the "adduct"), a larger molecule which includes all atoms of the two molecules—e.g., where the reaction does not further produce any other by-product. In using a reaction between two monolayers, some embodiments variously provide for very strong bonding that, for example, may be tailored to a particular combination of material layers which are to be joined together.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate having patterned metallization structures.

FIG. 1 illustrates features of a substrate 100 which, in accordance with an embodiment, includes structures that are bonded to each other with a monolayer of a compound. FIG. 1 also includes a cross-sectional detail side view 104 illustrating structures of substrate 100.

Substrate 100 is one example of an embodiment comprising metallization structures and one or more organic insulator materials which provide electrical isolation between various ones of said metallization structures. For example, substrate 100 may be a package substrate or a printed circuit board (PCB). A first layer and a second layer of substrate 100 may be bonded together by a monolayer of a compound which produced by a reaction an earlier formed monolayer. The earlier formed monolayer may include a first molecule (M1) which is subsequently reacted with another molecule (M2). The M1 molecule (at least when it is being deposited to form the first monolayer) may include functional groups R1, R2 which are substantially non-reactive with each other—e.g., wherein R1 includes at least one sulfur atom or at least one nitrogen atom to facilitate bonding, chemisorption, physisorption or other attachment to a metal surface portion.

In the example embodiment shown, metallization structures of substrate 100 include horizontal layers 122 of patterned conductive traces—e.g., where layers 122 variously extend in parallel with the xy plane of the xyz coordinate system shown. Such metallization structures may further include vias (or metal traces) 124 which variously extend vertically (e.g., along the z-axis) to couple respective ones of layers 122 to each other. Layers 122 and vias 124—e.g., comprising copper, aluminum, nickel, gold, silver and/or any of various other conductor materials—may facilitate electrical connectivity with one or each of two opposite sides 110, 112 of substrate 100. For example, connectivity with substrate 100 (e.g., through substrate 100) may be facilitated with conductive contacts (e.g., including the illustrative pads 126 shown) which are variously disposed on one or each of opposite sides 110, 112.

One or more dielectric materials of insulator layers 120 may promote electrical isolation of various ones of layers 122 and/or various ones of vias 124. In an embodiment, insulator layers 120 include any of a variety of dielectric compounds used, for example, in conventional package substrates and/or PCBs. Such compounds may include, but are not limited to, polyimide (PI), polytetrafluoroethylene (PTFE), Build-up Film (in general, any of various silica particle filled epoxy materials), a liquid crystal polymer (LCP), and polyetheretherketone (PEEK). In some embodiments, insulator layers 120 include a laminate material such as FR4, FR5, bismaleimide triazine (BT) resin, etc. Substrate 100 may have a woven or reinforced core (not shown) or—alternatively—may be coreless, in various embodiments.

Cross-sectional detail side view 104 illustrates structures that, for example, may be found in a region 102 of substrate 100. As shown in view 104, a metallization layer 140 may comprise metallization structures—such as the illustrative structures 142—that, for example, include one of layers 122 and/or various ones of vias 124. Metallization layer 140 may be disposed on a dielectric layer 130 (such as one of insulator layers 120), wherein one of metallization layer 140 and dielectric layer 130 includes a first surface portion. For example, the first surface portion may be a surface portion of dielectric layer 130 which is in one of the interface regions 152 shown. Alternatively, the first surface portion may be a surface portion of metallization structures 142 in one of the interface regions 162, 164 shown.

In such an embodiment, another dielectric layer 134 may be disposed on one or both of metallization layer 140 and dielectric layer 130. Dielectric layer 134 may include a second surface portion which is in the same one of interface regions 152, 162, 164 as is the first surface portion. The second surface portion may be bonded to the first surface portion via a monolayer of a compound. The monolayer of the compound may, for example, be an artifact of a process to bond various ones of metallization layer 140 and dielectric layers 130, 134 to each other. More particularly, in some embodiments, a molecule of the compound is the same as molecule which may be produced by a reaction between a molecule M1 is capable of forming a monolayer and another molecule M2 which includes two functional groups, one of which enables bonding, chemisorption, physisorption or other attachment to a dielectric surface portion. In some embodiments, the molecule M2 is also capable of forming a monolayer.

For example, a first monolayer 150, extending in some or all of interface regions 152, may facilitate at least in part a bonding of dielectric layers 130, 134 to one another. Alternatively or in addition, a second monolayer 160, extending in one or both of interface regions 162, 164, may facilitate at least in part a bonding of metallization layer 140 and dielectric layer 134 to one another. First monolayer 150 and second monolayer 160 may be contiguous with one another and/or may each include the same type of molecule, although some embodiments are not limited in this regard.

FIG. 1 also shows, in cross-sectional detail side views, respective stages 106, 108 of one example process to form a monolayer such as first monolayer 150 and/or second monolayer 160. As shown at stage 106, M1 molecules of a monolayer 170 may be attached to a side 132 of dielectric layer 130, wherein M2 molecules of another monolayer 172 are attached to a side 136 of dielectric layer 134. In some embodiments, M1 molecules of monolayer 170 are additionally or alternatively attached to one or more metallization structures 142 for subsequent bonding of metallization layer 140 with dielectric layer 134. Attachment of SAM 170 to side 132—and/or attachment of SAM 172 to side 136— may be performed according to any of a variety of techniques which, for example, are adapted from conventional self-assembling chemistry techniques. Examples of such techniques include, for example, dip-coating, spray coating, atomic layer deposition, chemical vapor deposition, and the like.

A SAM molecule may comprise one functional group (referred to herein as a "head group") which is to anchor to a surface, another functional group (referred to herein as an "end group") that is to provide a reaction site, and a moiety (also referred to herein as a "chain" or "tail") which extends between the head group and the end group. For example, with respect to the M1 molecule type of monolayer 170, the head group R1 and end group (e.g., R2 or R3) are represented symbolically with circles and diamonds (respectively) in the view of stage 106—e.g., wherein moiety X1 extends between such head group and end group. The head group R5 and end group R4 for monolayer 172 are represented symbolically with squares and triangles, respectively—e.g., wherein moiety X2 extends between such head group and end group.

A head group of a SAM molecule may include any of a variety of groups to facilitate reaction which attaches the SAM molecule to a surface such as that of a dielectric material or a metallization structure. SAM molecules may adhere to such a surface through chemisorption or physisorption, for example. The R1 head group of M1 may include any of a variety of functional groups comprising at least one sulfur atom or at least one nitrogen atom. Such a chemistry of the R1 group may promote chemisorption or other attachment of a M1 molecule on the metal (e.g., copper) surface, for example. By way of illustration and not limitation, the functional group R1 may include, or be a derivative of, any of a variety of disulfide groups of the form (S—S—Ra), where Ra is a hydrogen atom or an organic component of R1. Alternatively, R1 may include a thiol, for example.

In some embodiments, the functional group R1 includes or is a derivative of an amine group such as any of a variety of primary, secondary, tertiary or cyclic amines. Some examples of such an R1 group include various derivatives of aniline and 2-aminopentane. The functional group R1 may alternatively include, or be a derivative of, an azo group or any of a variety of azole groups such as imidazole, pyrazole, triazole, tertrazole. For example, R1 may include cyclic ring comprising a carbon atom by which X1 bonds to R1—e.g., wherein M1 includes a substituted imidazole. In other embodiments, R1 includes a pyridine derivative. The functional group R1 may alternatively include or be a derivative of an amide such as any of a variety of organic amide groups. In some embodiments, the R1 includes any of a variety of cyanoacrylate derivatives. For example, M1 may include a derivative of 2-octylcyanoacrylate or isobutyl cynoacrylate—e.g., where X1 comprises an octyl or isobutyl aliphatic ester chain.

In some embodiments, the functional group R2 may include, or be a derivative of, an acid such as any of a variety of organic acids which, for example, include a carboxyl (COOH) group. The functional group R2 may alternatively include, or be a derivative of, an acid anhydride such as any of a variety of organic acid anhydrides. In other embodiments, The functional group R2 may include, or be a derivative of, any of a variety of thioanhydrides such as benzoic thioanhydride. The functional group R2 may alternatively include, or be a derivative of, an aliphatic alcohol such as any of a variety of organic aliphatic alcohols. In still other embodiments, the functional group R2 may include, or be a derivative of, an aromatic alcohol such as any of a variety of organic aromatic alcohols. The functional group R2 may alternatively include, or be a derivative of, an unsaturated hydrocarbon such as any of a variety of aliphatic or aromatic chain molecules which, for example, comprise an alkenyl moeity (such as a vinyl group) or an alkyne moeity.

The head group and end group of an M1 molecule may be substantially non-reactive with each other, thereby mitigating self-polymerization and 3-D stackups which might otherwise contribute to low adhesion with organic adhesion promoters. In one example embodiment, an R1-R2 functional group combination of a M1 molecule includes a thiol of R1 and an organic alcohol of R2—e.g., wherein a structure R1-X1-R2 of the M1 molecule is HS-X1-OH. Excess M1 molecules may be washed away prior to the introduction of an M2 molecule, thereby further reducing the chance of 3-D stackups.

The molecule M1 of monolayer 170 may include an end group R2 at least upon attachment to layer 130 or metallization structures 142. Although some embodiments are not limited in this regard, the end group R2 may be subsequently reacted to produce a modified end group R3—e.g., where such reaction occurs prior to reaction with a M2 molecule of monolayer 172. The functional group R3 may include a product of such reaction involving R2—e.g., wherein the reaction results in acylation, esterification, or amide bond formation which removes, replaces or otherwise changes at least some of R2. For example, R2 may include or be a derivative of, an alcohol, an acid, or an acid anhydride, wherein R3 results from an esterification of R2. In some embodiments, the reaction to form R3 changes an acid anhydride or a thioanhydride of R2.

Referring now to the M2 molecule of monolayer 172, the end group R4 may include, or be a derivative of, an amine such as any of those described herein with reference to R1. Alternatively, R4 may include a thiol, for example. In some embodiments, R4 includes, or is a derivative of, a disulfide such as any of those described herein with reference to R1. The functional group R4 may alternatively include, or be a derivative of, an acid anhydride or an alcohol such as any of those described herein with reference to R2. The head group R5 of molecule M2 may include, or be a derivative of, an amine, an azole or an imide such as any of those described herein with reference to R1. In some embodiments, R5 includes a cyanoacrylate derivative such as any of those described herein with reference to R1. Since R1 and R5 are separated into two different molecules, polymerization may be mitigated, enabling the use of more reactive attachment pathways including a thiol, for example. Additionally, M1 and/or M2 may have a few (e.g., only two) functional groups which are reactive, thereby allowing a wider variety and/or higher reactivity of end group combinations R2, R4 (or R3, R4). In some embodiments, R4 and R5 are substantially non-reactive with each other. For example, R4 and R5 may each include a respective amine (e.g., NH2), a respective carboxyl group (e.g., COOH), a respective alcohol group (e.g., OH) or other such group which is not reactive with its own group type.

In an embodiment, the moiety X1 of an M1 molecule (or the moiety X2 of an M2 molecule) includes a short chain of carbon atoms, or alternatively—a long chain which is resistive of chain folding. As used herein with reference to a moiety such as X1 or X2, "short chain" refers to a chain of up to ten carbon atoms. Such a short chain may comprise a derivative a methyl group, ethyl group, octyl group or decyl group or any of a variety of hydrocarbons—e.g., wherein the short chain includes or is a derivative of an alkyl chain or an alkyne chain. In some embodiments, X1 or X2 includes or is a derivative of an allyl chain.

As shown at stage 108, monolayers 170, 172 may be brought in contact with one another to facilitate a reaction thereof. An intermediate moiety R6 produced by such reaction may form the resulting monolayer 174 (e.g., including some or all atoms of monolayers 170, 172). The respective end groups R2, R4 (or in some embodiments, R3, R4) of monolayers 170, 172 may be susceptible to reaction with each other. For brevity, such groups are referred to herein as being "complementary" to one another. A reaction between such end groups to form R6 may include an esterification reaction between an alcohol and an acid (or an acid anhydride), an amide bond formation between an acid (or an acid anhydride) and an amine, a cyclization reaction or the like. In an alternative embodiment, M2 molecules are not attached to layer 134 prior to reaction with M1 molecules of monolayer 170. For example, the M2 molecules may instead be reacted with monolayer 170 to form monolayer 174, where such reaction is prior to a later attachment of monolayer 174 to layer 134.

Figure 2:
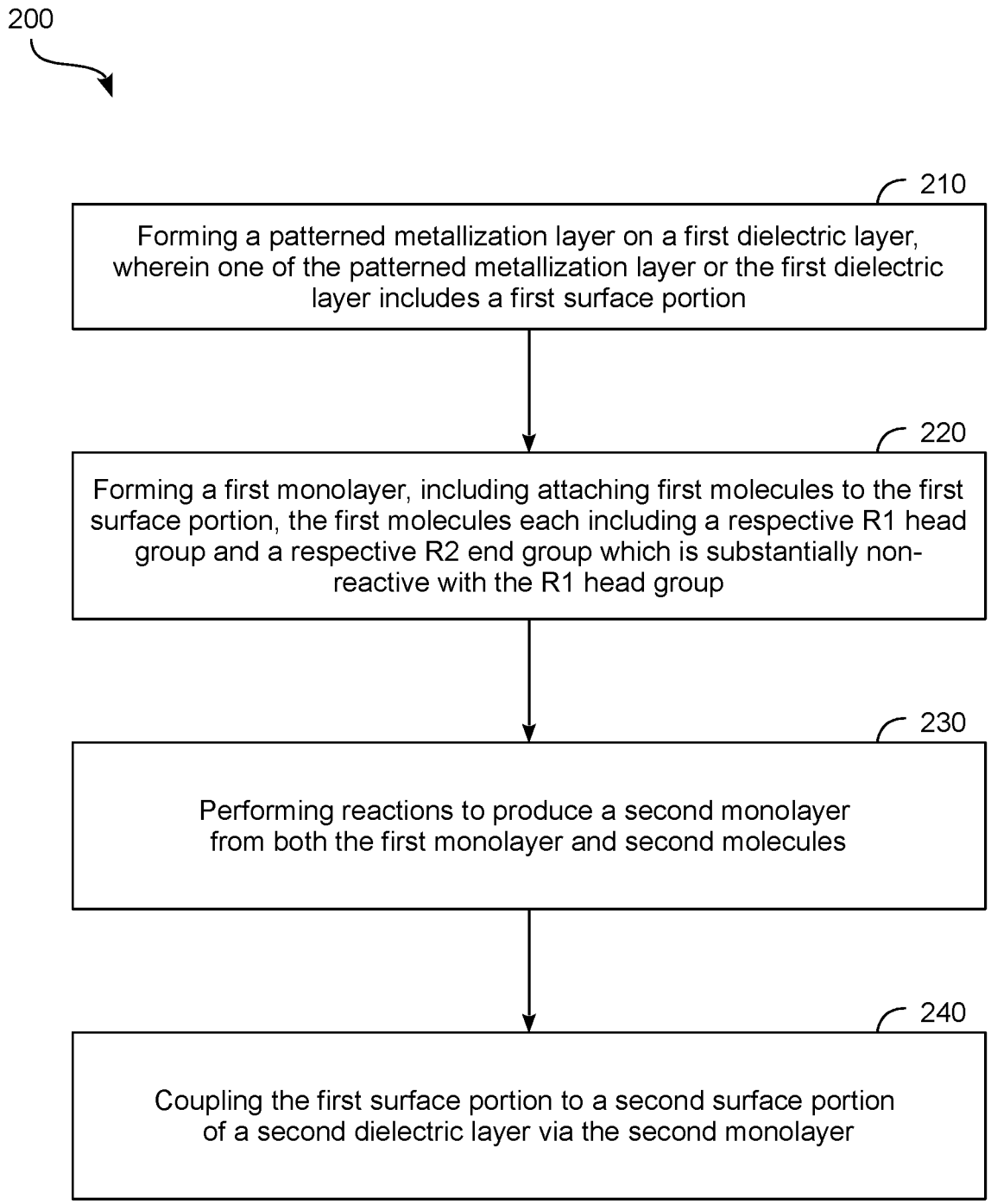
FIG. 2 is a flow diagram illustrating elements of a method for providing bonded layers of a substrate according to an embodiment.
Figure 3:
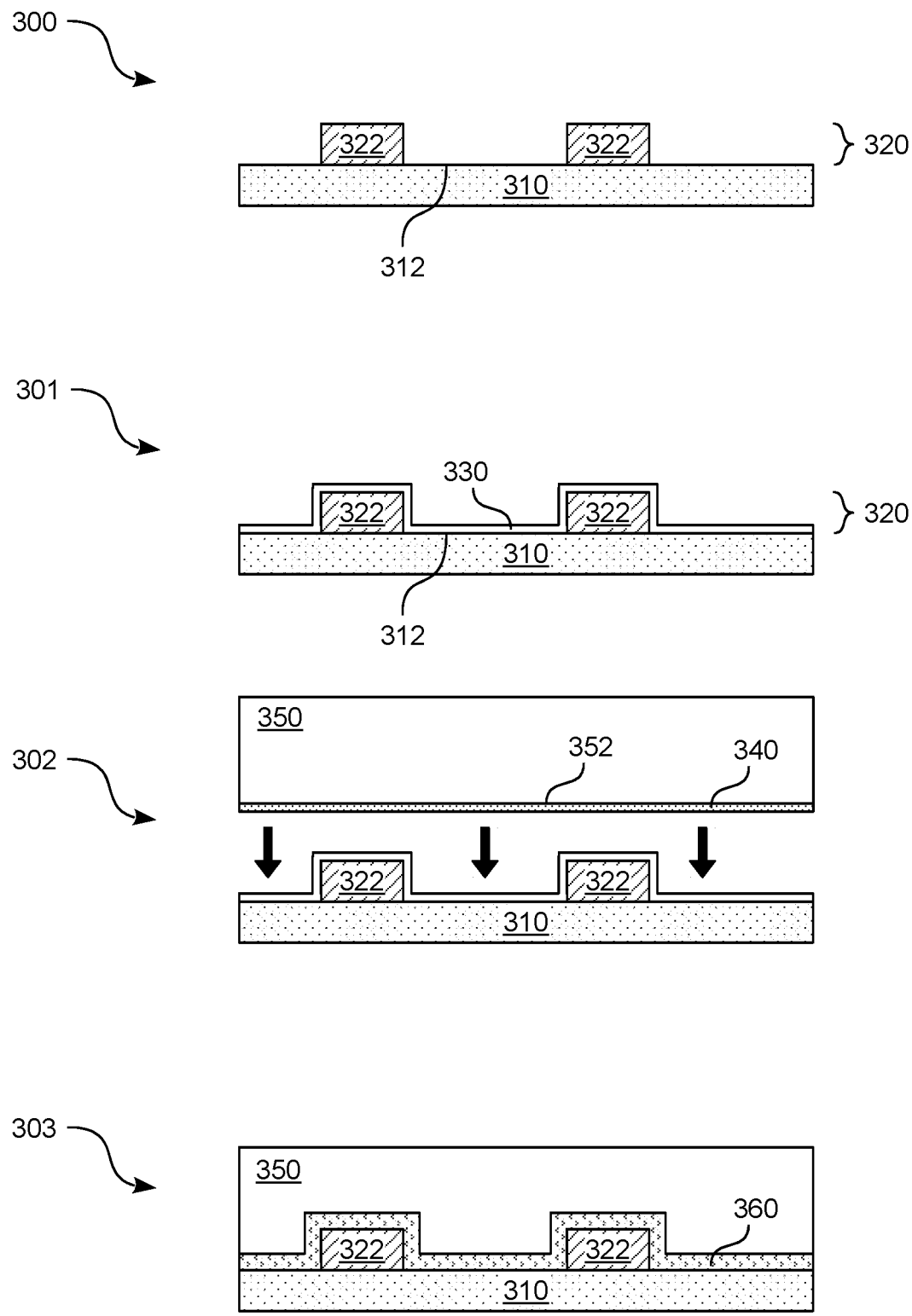
FIG. 3 shows cross-sectional diagrams each illustrating structures at a respective stage of a substrate manufacture process according to an embodiment.

FIG. 2 shows features of a method 200 to bond layers of a substrate according to an embodiment. Method 200 may include processes to fabricate some or all of the structure of substrate 100, for example. To illustrate certain features of various embodiments, method 200 is described herein with reference to structures shown in FIG. 3. However, any of a variety of additional or alternative structures may be fabricated according to method 200, in different embodiments.

As shown in FIG. 2, method 200 may include (at 210) forming a patterned metallization layer on a first dielectric layer, wherein one of the patterned metallization layer or the first dielectric layer includes a first surface portion. For example, referring now to FIG. 3, cross-sectional side views are shown for respective stages 300-303 of processing to adhere layers of a substrate according to an embodiment. Processing such as that which includes stages 300-303 may, for example, bond some or all of metallization layer 140 and dielectric layer 130, 134 to each other.

As shown at stage 300, a metallization layer 320 may be disposed on a side 312 of a layer 310. Metallization layer 320 may include patterned metallization structures 322 that, for example, have been formed by metal deposition—e.g., including electroplating, electroless deposition or the like—and subsequent etching of the deposited metal through a patterned mask (not shown). Metallization layer 320 may include copper (Cu), gold (Au), silver (Ag), aluminum (Al), platinum (Pt), nickel (Ni) and/or any of a variety of other metals (e.g., wherein metallization layer 320 may include a metal oxide). Layer 310 may include a dielectric material which includes any of a variety of functional groups—e.g., such as, but not limited to a hydroxide group, epoxide group, carboxyl group, amine group, thiol group—to which SAM molecules may adhere.

Method 200 may further comprise (at 220) forming a first monolayer, including attaching first molecules to the first surface portion, the first molecules each including a respective R1 head group and a respective R2 end group which is substantially non-reactive with the R1 head group. In an embodiment, the R1 head group includes a first moiety comprising a sulfur atom or a nitrogen atom—e.g., wherein the R2 end group comprises one of an acid moiety, an acid anhydride moiety, an aliphatic alcohol moiety, an aromatic alcohol moiety, an unsaturated hydrocarbon moiety, an epoxy moiety, or a phenol moiety. The first moiety may comprise one of a thiol moiety, a disulfide moiety, an amine moiety, an azole moiety, an amide moiety, an imide moiety, a cyanoacrylate derivative, an imidazole moiety, a pyrazole moiety, a triazole moiety, a tetrazole moiety, a thiazole moiety, a isothiazole, or a thiadiazole moiety.

As shown at stage 301, a SAM 330 may be formed on exposed portions of side 312 and/or one or more respective surfaces of metallization structures 322—e.g., some or all of which may include the first surface portion. Formation of SAM 330 may include dip-coating, spray coating, atomic layer deposition, chemical vapor deposition and/or other processes adapted, for example, from conventional techniques. It is to be appreciated that a linker compound may be utilized to promote chemisorption by a metal (of metallization structures 322, for example) with molecules of SAM 330.

In an embodiment, method 200 further includes, (at 230) performing reactions to produce a second monolayer from both the first monolayer and second molecules. Method 200 may further comprise (at 240) coupling the first surface portion to a second surface portion of a second dielectric layer via the second monolayer. The second molecules may each comprise a respective R5 head group and a respective R4 end group—e.g., wherein the R5 head group is substantially non-reactive with the R4 end group. For example, the R4 end group may comprise one of an amine moiety, a thiol moiety, a disulfide moiety, an acid anhydride moiety, an epoxy moiety, a phenol moiety, or an alcohol moiety. In such an embodiment, the R5 head group may comprise one of an amine moiety, an azole moiety, an imide moiety, an epoxy moiety, a phenol moiety, or a cyanoacrylate derivative. In some embodiments, the R5 head group is also substantially non-reactive with the R2 end group. Although some embodiments are not limited in this regard, the performing reactions at 230 may include performing one of an acylation of the R2 end group or an esterification of the R2 end group prior to reaction with the second molecules. Such acylation or esterification may generate from the R2 end group an R3 end group which is relatively more reactive with the R4 head group.

Referring again to FIG. 3, another SAM 340 may be disposed on SAM 330 (at stage 302) to facilitate a reaction between the two. By way of illustration and not limitation, SAM 340 may be disposed on a side 352 of a layer 350 that, for example, includes a dielectric material to facilitate electrical isolation of metallization structures 322. In such an embodiment, SAM 340 may be brought into contact with SAM 330 while layer 350 is coupled to SAM 340. Layers 310, 350 may correspond functionally to dielectric layers 130, 134, for example.

A first molecule of SAM 330 may include an end group that is susceptible to a reaction with an end group of a second molecule, wherein SAM 340 includes the second molecule. As shown at stage 303, reaction between SAM 330 and SAM 340 may result in the formation of a SAM 360 which is attached to both layer 350 and one or both of layer 310 and some or all metallization structures 322. In such an embodiment, a molecule of SAM 360 may be an adduct which includes all atoms of the first molecule and all atoms of the second molecule.

Formation of SAM 360 may include exposing SAMs 330, 340 to one or more conditions (e.g., including UV light, heat, pressure and/or the presence of a metal catalyst) to promote reaction between SAM 330 and SAM 340. Although some embodiments, are not limited in this regard, method 200 may further comprise additional processing (not shown) to facilitate electrical connectivity with some or all of the patterned metallization layer 320. For example, any of a variety of subtractive processes (such as etching, planarization, or the like) may be performed to remove portions of layer 350 and/or portions of SAM 360—e.g., wherein a remaining portion of layer 350 leaves respective surfaces of metallization structures 322 exposed for later electrical coupling.

As variously shown in method 200 and stages 300-303, performing the reactions (at 230) may comprise forming a third monolayer such as SAM 340, wherein such forming includes attaching the second molecules to the second surface portion. In such an embodiment, the coupling of the first surface portion to the second surface portion at 240 may comprise performing a reaction with the first monolayer and the third monolayer, the reaction after the forming of the first monolayer at 220 and also after forming the third monolayer.

Figure 4:
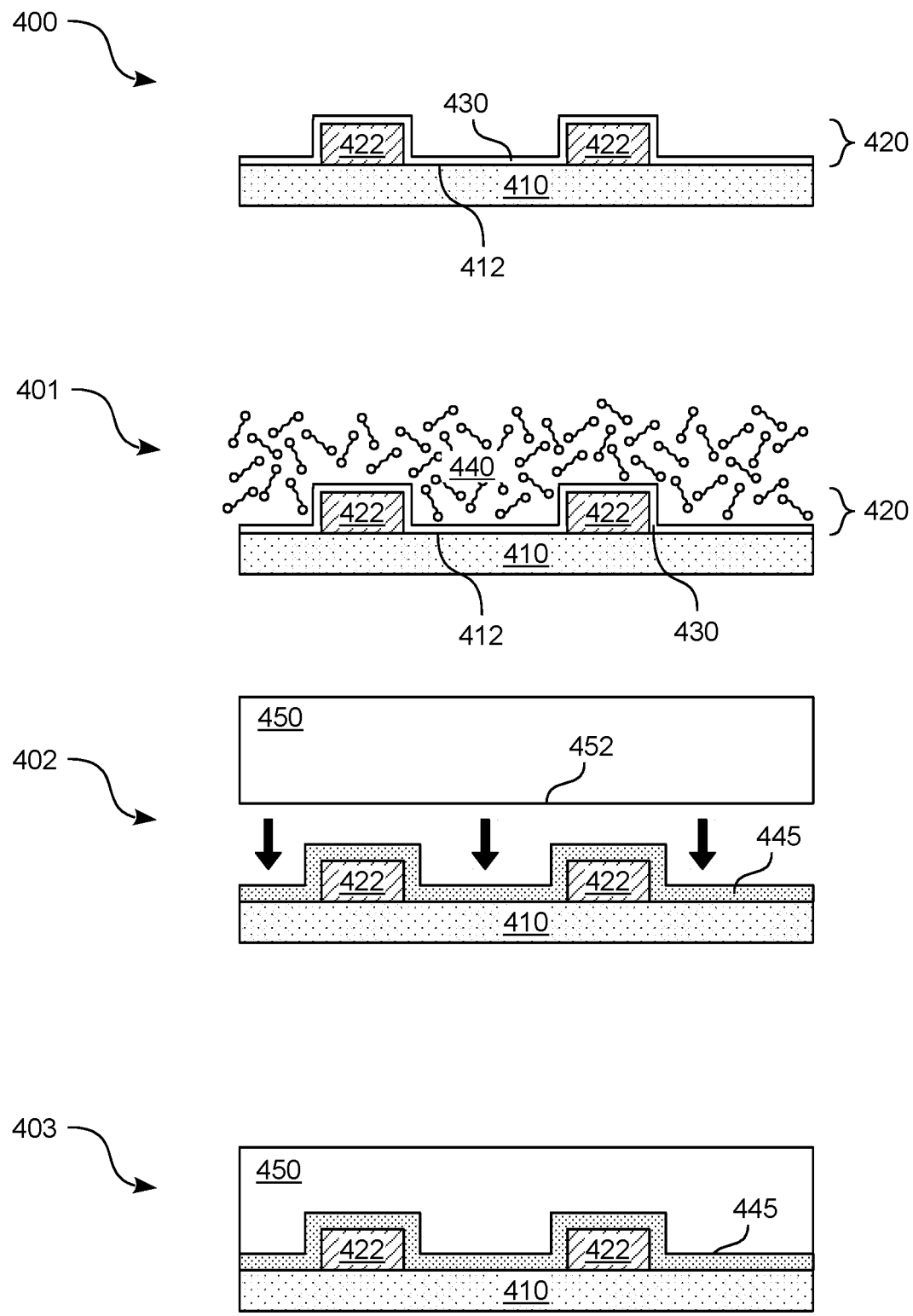
FIG. 4 shows cross-sectional diagrams each illustrating structures at a respective stage of a substrate manufacture process according to an embodiment.

In an alternative embodiment, coupling the first surface portion to the second surface portion at 240 may comprise attaching the second molecules to the second surface portion only after the performing the reactions at 230 to produce the second monolayer. For example, referring now to FIG. 4, cross-sectional side views are shown for respective stages 400-403 of processing to adhere layers of a substrate according to another embodiment. Processing which includes stages 400-403 may, for example, bond some or all of metallization layer 140 and dielectric layer 130, 134 to each other.

As shown at stage 400, a metallization layer 420 (e.g., having features of metallization layer 320) may be disposed on a side 412 of a layer 410. A SAM 430 may be formed on exposed portions of side 412 and/or one or more respective surfaces of metallization structures 422—e.g., some or all of which may include the first surface portion. In such an embodiment, end groups of SAM 430 may be substantially non-reactive with head groups of SAM 430. Formation of SAM 430 may include dip-coating, spray coating, atomic layer deposition, chemical vapor deposition and/or other processes adapted, for example, from conventional techniques.

As shown at stage 401, second molecules 440 (other than first molecules of SAM 430) may be sprayed, coated or otherwise deposited onto SAM 430. End groups of the second molecules 440 may be reactive with end groups of SAM 430 to form third molecules which are self assembled on side 412. In such an embodiment, head groups of the second molecules 440 may be substantially non-reactive with end groups of the second molecules 440—e.g., where the head groups of the second molecules 440 are also substantially non-reactive with end groups of SAM 430.

For example, reaction between SAM 430 and the second molecules 440 may result in the formation (at stage 402) of a SAM 445 on side 412 and/or on one or more respective surfaces of metallization structures 422. A layer 450 (e.g., including a dielectric material) may then be brought into contact with SAM 445 after formation thereof. Layers 410, 450 may correspond functionally to dielectric layers 130, 134, for example. As shown at stage 403, head groups of SAM 445 (e.g., including original head groups of molecules 440) may attach to a side 452 of layer 450. Such attachment may facilitate bonding of layers 410, 450 to one another via SAM 445.

Referring again to FIG. 2, the patterned metallization layer or the first dielectric layer may, in some embodiments, comprise a third surface portion, wherein the second dielectric layer further comprises a fourth surface portion. In such an embodiment, method 200 may further comprise forming a fourth monolayer, including attaching third molecules to the third surface portion. A fifth monolayer may also be formed by attaching fourth molecules to the fourth surface portion. Subsequently additional reactions may be performed to produce a sixth monolayer from both the fourth monolayer and the fifth monolayer—e.g., where the third surface portion is coupled to the fourth surface portion via the sixth monolayer.

Figure 5:
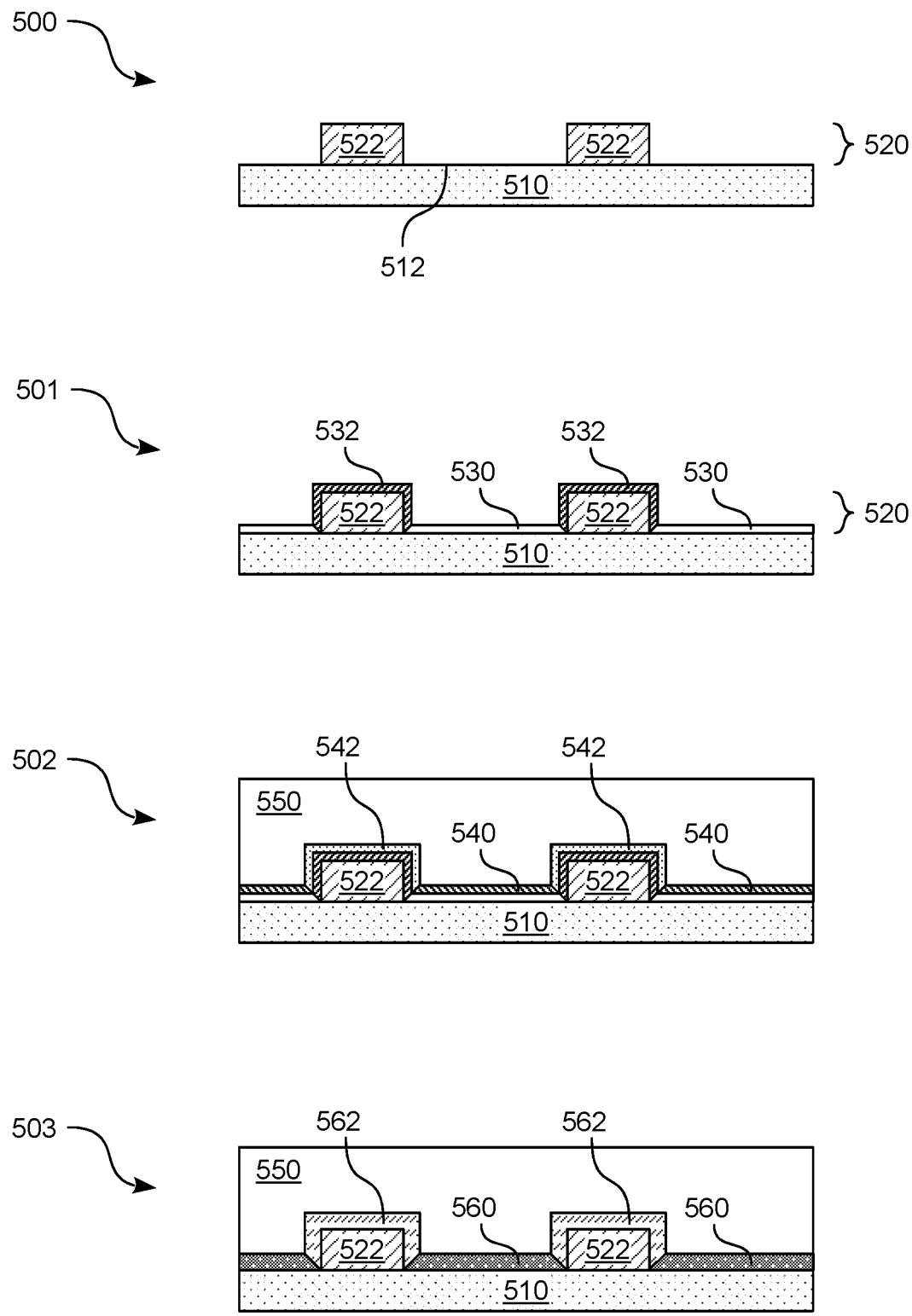
FIG. 5 shows cross-sectional diagrams each illustrating structures at a respective stage of a substrate manufacture process according to an embodiment.

For example, bonding of substrate structures may include performing reactions between different pairs of molecules types. For example, referring now to FIG. 5, cross-sectional side views are shown for respective stages 500-503 of processing to adhere layers of a substrate according to an embodiment. Processing such as that which includes stages 500-503 may, for example, include some or all of the features of method 200.

As shown at stage 500, a metallization layer 520 may be disposed on a side 512 of a layer 510. Metallization layer 520 may include patterned metallization structures 522 that, for example, have been formed by metal deposition and subsequent etching of the deposited metal through a patterned mask (not shown). Layer 510 may include a dielectric material to which SAM molecules may adhere.

At stage 501, a SAM 530 may be formed on exposed portions of side 512, wherein a different SAM 532 is instead disposed on one or more of the respective surfaces of metallization structures 522. Molecules of SAM 530 may each include a head group which provides bonding to a dielectric material of layer 510. By contrast, molecules of SAM 532 may instead include a different head group which is more effective at bonding to a metal surface metallization structures 522. In such an embodiment, an end group of SAMs 530 may be substantially non-reactive with a head group of SAMs 530—e.g., where an end group of SAMs 532 is substantially non-reactive with a head group of SAMs 532. Masked deposition techniques may be adapted to provide for the selective formation of SAMs 530, 532 on different respective material surface portions of side 512 and metallization structures 522.

At stage 502, SAMs 540, 542 may be disposed, respectively, on SAMs 530, 532 to facilitate various reactions to facilitate adhering of layer 550. By way of illustration and not limitation, SAM 540 may be disposed one or more regions, on a side of a layer 550, which are to align with regions of SAM 530. Similarly, SAM 542 may be disposed in one or more other regions, on the same side of layer 550, which are instead to align with regions of SAM 532. In such an embodiment, molecules of SAM 540 and molecules of SAM 542 may include respective groups which variously provide bonding to a dielectric material of layer 550. In such an embodiment, an end group of SAMs 540 may be substantially non-reactive with a head group of SAMs 540—e.g., where an end group of SAMs 542 is substantially non-reactive with a head group of SAMs 542. Molecules of SAM 530 and molecules of SAM 540 may include respective end groups which are complementary to each other at least insofar as they are prone to first type of reaction with each other. Similarly, molecules of SAM 532 and molecules of SAM 542 may include respective end group which are complementary to each other, enabling a second type of reaction with each other.

As shown at stage 503, a first reaction between SAM 530 and SAM 540 may result in the formation of a SAM 560 which is attached to both layer 550 and to one or more surface portions layer 510. A second reaction between SAM 532 and SAM 542 may result in the formation of a SAM 562 which is attached to both layer 550 and to one or more surface portions of metallization structures 522. The first reaction and the second reaction may variously include respective characteristics of SAM reactions which are described herein.

In another embodiment, a single SAM—disposed on one surface—is to bond with multiple SAMs which are each disposed on another surface. For example, respective molecules of the multiple SAMs (including SAMs 530, 532 for example) may have the same end group or similar end groups, wherein the single SAM is complementary to the end group or groups. For example, each of SAMs 540, 542 may alternatively include the same type of molecule, the end groups of which are complementary to both end groups of SAM 530 and end groups of SAM 532. In such an embodiment, SAMs 560, 562 formed by respective types of reactions may include different respective molecules which, nevertheless, variously bond to layer 550 via the same type of functional group.

Figure 6:
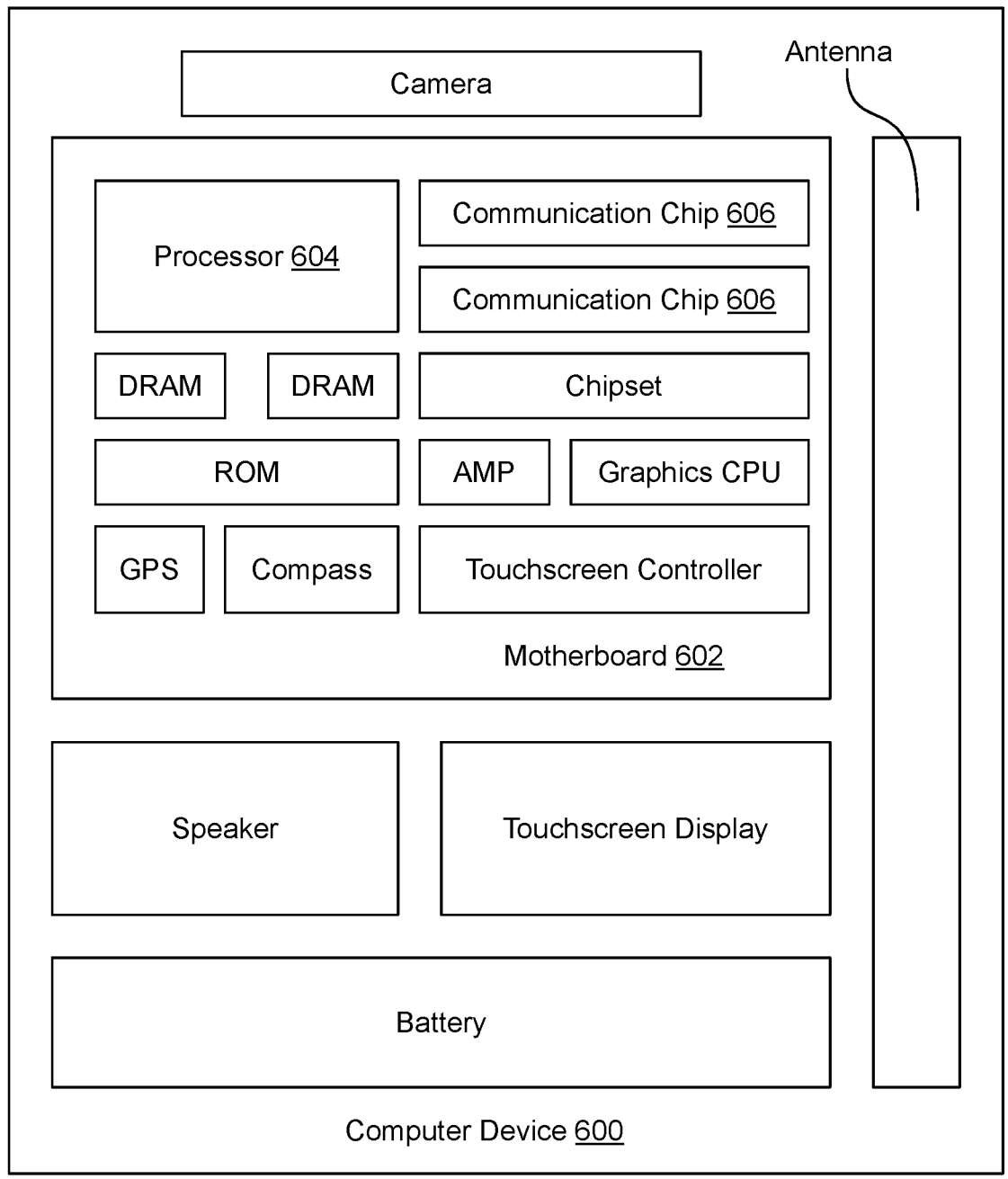
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
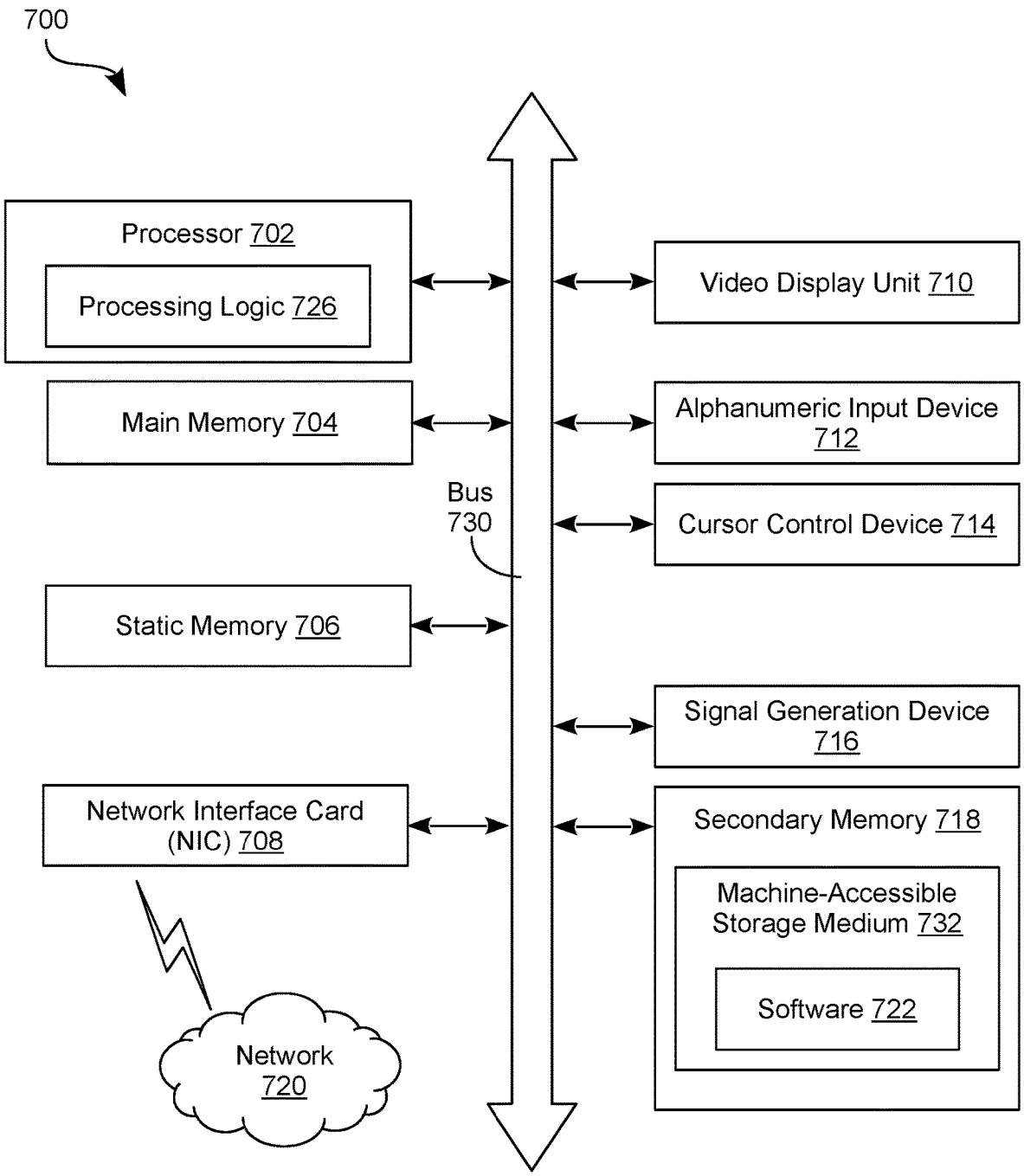
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 8:
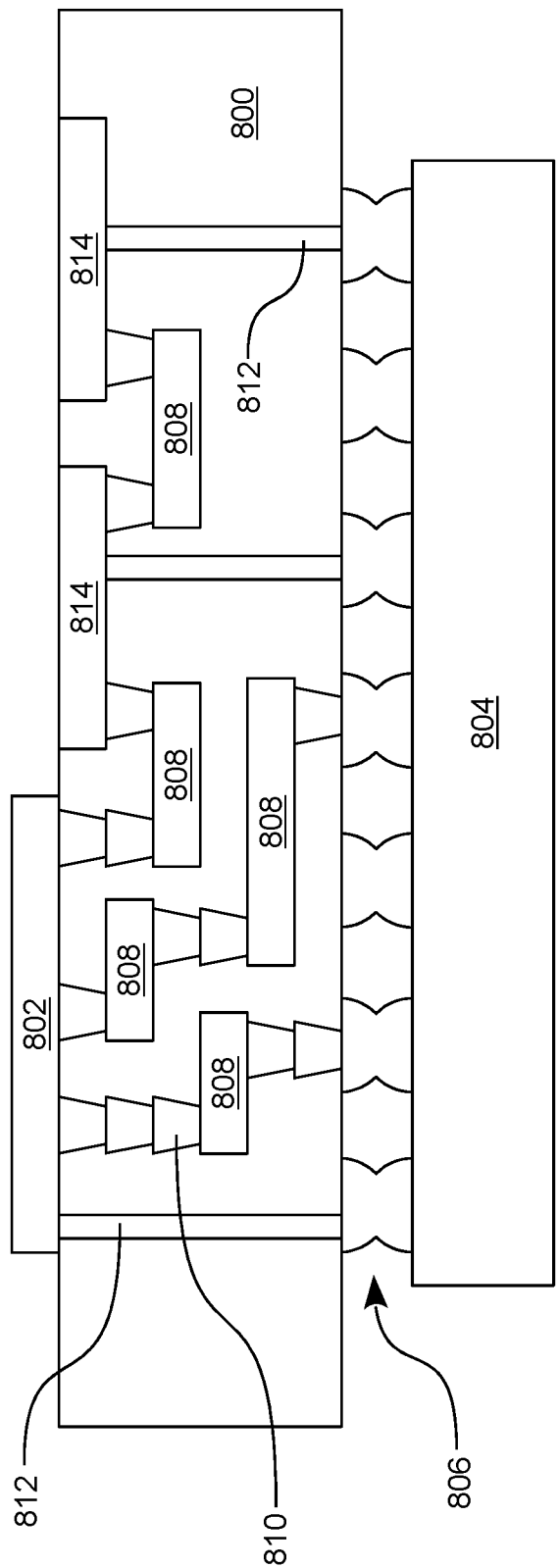
FIG. 8 is a cross-sectional view of an interposer implementing one or more embodiments.

FIG. 8 illustrates an interposer 800 that includes one or more embodiments. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802, 804 are attached to opposing sides of the interposer 800. In other embodiments, the first and second substrates 802, 804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with some embodiments, apparatuses or processes disclosed herein may be used in the fabrication of interposer 800.

Techniques and architectures for bonding layers of a circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A circuit device for communicating a signal, the circuit device comprising:
   a first dielectric layer;
   a patterned metallization layer on the first dielectric layer, wherein one of the patterned metallization layer or the first dielectric layer comprises a first surface portion;
   a second dielectric layer comprising a second surface portion; and
   a first monolayer of first molecules, wherein the first monolayer bonds the first surface portion and the second surface portion to each other, wherein the first molecules are each a chemical equivalent to a product of one or more reactions with a second monolayer of second molecules and third molecules, the second molecules each comprising a respective R1 head group and a respective R2 end group which is substantially non-reactive with the R1 head group, wherein the R1 head group comprises a first moiety comprising a sulfur atom or a nitrogen atom, wherein the R2 end group comprises one of an acid moiety, an acid anhydride moiety, an aliphatic alcohol moiety, an aromatic alcohol moiety, an unsaturated hydrocarbon moiety, an epoxy moiety, or a phenol moiety;
   wherein:
   the third molecules each comprise a respective R5 head group and a respective R4 end group;
   the first molecules are each coupled to the first surface portion via a respective R1 head group;
   the first molecules are each coupled to the second surface portion via a respective R5 head group;
   the first molecules each comprise an intermediary moiety which is a chemical equivalent to a product of a reaction between the R2 end group and the R4 end group;
   the R4 end group comprises one of an amine moiety, a thiol moiety, a disulfide moiety, an acid anhydride moiety, an epoxy moiety, a phenol moiety, or an alcohol moiety; and
   the R5 head group comprises one of an amine moiety, an azole moiety, an imide moiety, an epoxy moiety, a phenol moiety, or a cyanoacrylate derivative.

2. The circuit device of claim 1, wherein the first moiety comprises one of a thiol moiety, a disulfide moiety, an amine moiety, an azole moiety, an amide moiety, an imide moiety, a cyanoacrylate derivative, an imidazole moiety, a pyrazole moiety, a triazole moiety, a tetrazole moiety, a thiazole moiety, a isothiazole, or a thiadiazole moiety.

3. The circuit device of claim 2, wherein the first moiety comprises the thiol moiety.

4. The circuit device of claim 1, wherein the R5 head group is substantially non-reactive with the R4 end group.

5. The circuit device of claim 4, wherein the R5 head group is substantially non-reactive with the R2 end group.

6. The circuit device of claim 1, wherein the one or more reactions comprise one of an acylation of the R2 end group or an esterification of the R2 end group.

7. A method for fabricating circuit structures, the method comprising:
   forming a patterned metallization layer on a first dielectric layer, wherein one of the patterned metallization layer or the first dielectric layer comprises a first surface portion;
   forming a first monolayer, comprising attaching first molecules to the first surface portion, the first molecules each comprising a respective R1 head group and a respective R2 end group which is substantially non-reactive with the R1 head group, wherein the R1 head group comprises a first moiety comprising a sulfur atom or a nitrogen atom, wherein the R2 end group comprises one of an acid moiety, an acid anhydride moiety, an aliphatic alcohol moiety, an aromatic alcohol moiety, an unsaturated hydrocarbon moiety, an epoxy moiety, or a phenol moiety;
   performing reactions to produce a second monolayer from both the first monolayer and second molecules; and
   coupling the first surface portion to a second surface portion of a second dielectric layer via the second monolayer;
   wherein:
   the second molecules each comprise a respective R5 head group and a respective R4 end group, wherein the R5 head group is substantially non-reactive with the R4 end group;
   the R4 end group comprises one of an amine moiety, a thiol moiety, a disulfide moiety, an acid anhydride moiety, an epoxy moiety, a phenol moiety, or an alcohol moiety; and
   the R5 head group comprises one of an amine moiety, an azole moiety, an imide moiety, an epoxy moiety, a phenol moiety, or a cyanoacrylate derivative.

8. The method of claim 7, wherein the first moiety comprises one of a thiol moiety, a disulfide moiety, an amine moiety, an azole moiety, an amide moiety, an imide moiety, a cyanoacrylate derivative, an imidazole moiety, a pyrazole moiety, a triazole moiety, a tetrazole moiety, a thiazole moiety, a isothiazole, or a thiadiazole moiety.

9. The method of claim 8, wherein the first moiety comprises the thiol moiety.

10. The method of claim 7, wherein the R5 head group is substantially non-reactive with the R2 end group.

11. The method of claim 7, wherein performing reactions to produce the second monolayer comprises performing one of an acylation of the R2 end group or an esterification of the R2 end group.

12. The method of claim 7, wherein coupling the first surface portion to the second surface portion comprises attaching the second molecules to the second surface portion after performing the reactions to produce the second monolayer.

13. The method of claim 7, wherein performing reactions to produce the second monolayer comprises forming a third monolayer, comprising attaching the second molecules to the second surface portion, and wherein coupling the first surface portion to the second surface portion comprises:
   after forming the first monolayer and after forming the third monolayer, performing a reaction with the first monolayer and the third monolayer.

14. The method of claim 13, wherein the patterned metallization layer or the first dielectric layer comprises a third surface portion, wherein the second dielectric layer further comprises a fourth surface portion, the method further comprising:
   forming a fourth monolayer, comprising attaching third molecules to the third surface portion;
   forming a fifth monolayer, comprising attaching fourth molecules to the fourth surface portion;
   performing reactions to produce a sixth monolayer from both the fourth monolayer and the fifth monolayer; and
   coupling the third surface portion to the fourth surface portion via the sixth monolayer.

15. A system for communicating a signal, the system comprising:
- a circuit device comprising:
  - a first dielectric layer;
  - a patterned metallization layer on the first dielectric layer, wherein one of the patterned metallization layer or the first dielectric layer comprises a first surface portion;
  - a second dielectric layer comprising a second surface portion; and
  - a first monolayer of first molecules, wherein the first monolayer bonds the first surface portion and the second surface portion to each other, wherein the first molecules are each a chemical equivalent to a product of one or more reactions with a second monolayer of second molecules and third molecules, the second molecules each comprising a respective R1 head group and a respective R2 end group which is substantially non-reactive with the R1 head group, wherein the R1 head group comprises a first moiety comprising a sulfur atom or a nitrogen atom, wherein the R2 end group comprises one of an acid moiety, an acid anhydride moiety, an aliphatic alcohol moiety, an aromatic alcohol moiety, an unsaturated hydrocarbon moiety, an epoxy moiety, or a phenol moiety; and
- a display device coupled to the circuit device, the display device to generate a display based on a signal communicated with a conductor of the patterned metallization layer;

wherein:
  the third molecules each comprise a respective R5 head group and a respective R4 end group;
  the first molecules are each coupled to the first surface portion via a respective R1 head group;
  the first molecules are each coupled to the second surface portion via a respective R5 head group;
  the first molecules each comprise an intermediary moiety which is a chemical equivalent to a product of a reaction between the R2 end group and the R4 end group;
  the R4 end group comprises one of an amine moiety, a thiol moiety, a disulfide moiety, an acid anhydride moiety, an epoxy moiety, a phenol moiety, or an alcohol moiety; and
  the R5 head group comprises one of an amine moiety, an azole moiety, an imide moiety, an epoxy moiety, a phenol moiety, or a cyanoacrylate derivative.

16. The system of claim 15, wherein the first moiety comprises one of a thiol moiety, a disulfide moiety, an amine moiety, an azole moiety, an amide moiety, an imide moiety, a cyanoacrylate derivative, an imidazole moiety, a pyrazole moiety, a triazole moiety, a tetrazole moiety, a thiazole moiety, a isothiazole, or a thiadiazole moiety.

17. The system of claim 16, wherein the first moiety comprises the thiol moiety.

18. The system of claim 15, wherein the R5 head group is substantially non-reactive with the R4 end group.

19. The system of claim 18, wherein the R5 head group is substantially non-reactive with the R2 end group.

* * * * *

UNITED STATES PATENT AND TRADEMARK OFFICE
CERTIFICATE OF CORRECTION

| | |
|---|---|
| PATENT NO. | : 11,177,232 B2 |
| APPLICATION NO. | : 15/943289 |
| DATED | : November 16, 2021 |
| INVENTOR(S) | : Nad et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Third Day of September, 2024

Katherine Kelly Vidal
*Director of the United States Patent and Trademark Office*